United States Patent
Carlin et al.

[11] Patent Number: 5,124,639
[45] Date of Patent: Jun. 23, 1992

[54] PROBE CARD APPARATUS HAVING A HEATING ELEMENT AND PROCESS FOR USING THE SAME

[75] Inventors: Scott J. Carlin; Samuel Roberts, Jr., both of Austin, Tex.

[73] Assignee: Motorola, Inc., Schaumburg, Ill.

[21] Appl. No.: 616,272

[22] Filed: Nov. 20, 1990

[51] Int. Cl.⁵ .................... G01R 15/12; G01R 31/00
[52] U.S. Cl. ...................... 324/158 P; 324/158 F; 439/482
[58] Field of Search ............ 324/158 F, 158 P, 72.5, 324/158 R; 439/482, 912; 219/209, 210

[56] References Cited

U.S. PATENT DOCUMENTS

| | | | |
|---|---|---|---|
| 3,710,251 | 1/1973 | Hagge et al. | 324/158 F |
| 3,963,985 | 6/1976 | Geldermans | 324/158 P |
| 4,172,993 | 10/1979 | Leach | 324/158 F |
| 4,839,587 | 6/1989 | Flatley et al. | 324/158 F |
| 4,870,355 | 9/1989 | Kufis et al. | 324/158 F |
| 4,931,726 | 6/1990 | Kasukabe et al. | 324/158 P |
| 4,962,355 | 10/1990 | Holderfield et al. | 324/158 P |

*Primary Examiner*—Vinh Nguyen
*Attorney, Agent, or Firm*—Robert L. King

[57] ABSTRACT

A probe card apparatus is used to functionally test an integrated circuit wafer at elevated temperatures. In one form, a probe card having a cavity between first and second opposite sides is provided. Within the probe card cavity is a probe card ring which is used to support and position a plurality of probe leads. The plurality of probe leads are attached to the first side of the probe card and extend toward the cavity and are used to make electrical contact with an integrated circuit wafer. Radiant heat is provided in close proximity to the probe card ring for heating the plurality of probe leads to a predetermined temperature and for sustaining the predetermined temperature to accurately keep each probe lead at a predetermined location within the cavity.

20 Claims, 3 Drawing Sheets

PROBE CARD APPARATUS HAVING A HEATING ELEMENT AND PROCESS FOR USING THE SAME

TECHNICAL FIELD OF THE INVENTION

The present invention relates to an apparatus used for functional testing integrated circuits wafers, and more specifically to a probe card apparatus used for functional testing integrated circuit wafers and a process for using the same.

BACKGROUND OF THE INVENTION

In the manufacture of integrated circuits (ICs), several testing operations are performed to verify the functionality of the circuits during fabrication. One such operation occurs prior to packaging the ICs, also referred to as "die," while the ICs are in wafer form. Many manufacturers refer to this testing operation as "wafer probe." One of the primary purposes of wafer probe is to run diagnostic tests to identify die which are not functioning properly, so that only functional die undergo remaining manufacturing operations, such as packaging. By segregating the malfunctioning die from the good die early on, IC manufacturers reduce costs associated with unnecessary, subsequent processing of units which will eventually be discarded. To further segregate defective die, some manufacturers use a hot temperature wafer probe operation. Hot temperature probing serves the same purposes as conventional probing, but additionally identifies die which malfunction at elevated temperatures, similar to temperatures the die would be exposed to during operating lifetime. The fallout of malfunctioning die usually increases if hot temperature probing is employed because die which marginally pass conventional wafer probe often fail hot temperature probe testing.

A hot temperature wafer probe operation involves placing a wafer having a plurality of ICs, or die, onto a chuck, which is quite similar to conventional wafer probing. However, in hot temperature wafer probe, the chuck is typically heated to a temperature much higher than room temperature, for example 100° C. Heating the chuck thereby heats the wafer and each die on the wafer. Upon reaching the desired temperature, diagnostic testing is performed to identify malfunctioning die. Testing is accomplished by bringing a probe card having a plurality of probe leads, or probe needles, in electrical contact with an individual die. Electrical signals are sent through the probe card to the die via the probe leads, and responses to these signals are fed to a computer which determines if the die is functioning properly. As stated earlier, by elevating the temperature of the die during wafer probe, marginally functional die will fail diagnostic testing with an increased probability over room temperature testing. Thus, costs are further reduced over conventional wafer probe due to a reduced number of die undergoing subsequent processing. In addition to reducing costs, hot temperature probing also helps to eliminate the number of marginally functional die that might be sold to a customer.

Although there is a trend by IC manufacturers to implement hot temperature wafer probing, IC manufacturers have discovered problems associated with this type of testing. A significant problem is that the elevated temperatures of the chuck and the wafer tend to warp the probe card and change the position of the probe leads such that the leads do not align properly to contact points, or bonding pads, on the die. Probe lead misalignment can also be the result of probe lead movement during testing, in other words, the probe leads were initially aligned properly but moved during a point in the testing sequence. Probe lead movement, or drift, is caused by a temperature difference between the heated chuck and the probe card. The probe card is typically held at room temperature, or about 25° C., and the chuck and wafer are held at a much higher temperature, near 100° C. When the probe card is brought into close proximity to the chuck and the wafer, the temperature gradient will result in a temperature increase in the probe card and in the probe leads. The temperature change in the probe card, in turn, causes the card to warp and often moves the probe leads. Even if the temperature change is not sufficient to significantly warp the probe card, the probe leads may still be affected due to a softening of an epoxy material or other adhesive material which is used to hold the probe leads in place. The softening of the epoxy material allows the probe leads to shift positions, rather than remain in positions predefined by probe card manufacturers to meet a particular bonding pad configuration of an IC.

A few solutions to the problem of hot temperature probing have been proposed. One solution is the addition of a "broad stiffener" which acts to stiffen the probe card to prevent it from warping. However, as mentioned earlier, probe leads may shift position even though the probe card does not warp. Another solution has been to add a heat sink to the probe card to remove any heat introduced by the heated chuck and wafer. Yet, a heat sink does not eliminate the presence of a temperature gradient between the chuck and the probe card, which is the most prominent contributor to unwanted movement of probe leads. Still another solution is to make the probe card, and other elements of a probe card apparatus, from materials having low coefficients of thermal expansion. In doing so, the amount of warpage and overall movement of the probe leads is believed to be reduced in the presence of a temperature gradient. This solution has worked to an extent, however has not completely eliminated the problem of probe lead movement during wafer probe testing.

A frequently used approach to resolving the problem of probe lead movement during hot temperature probing is to bring the probe card and probe leads in close proximity to the heated chuck without actually making contact to a die. The temperature of the probe card and the probe leads will rise and will eventually stabilize at a temperature near the temperature of the chuck. Upon achieving a stabilized temperature, the probe leads reach a stabilized position such that the probe leads can be accurately aligned to the bonding pads on a die. Although the temperature of the probe leads will further increase upon contacting bonding pads on the die, the temperature change will be much less than if the probe card was initially at room temperature. Thus by "preheating" the probe card, the movement of the probe leads is minimized and the probe leads can be accurately aligned to bonding pads of a die. A significant disadvantage in using this approach in a manufacturing environment is that "preheating" the probe card for each wafer takes a considerable amount of time, on the order of 1-2 minutes per wafer. Inefficient use of time in "preheating" a probe card is a considerable disadvantage in a competitive industry in which fast cycle time is a key to a successful business. Therefore, a need exists for an improved probe card apparatus, and more specifically for an improved probe card apparatus for functional testing at elevated temperatures and a process for using the same, which significantly reduces probe lead movement without compromising cycle time.

BRIEF SUMMARY OF THE INVENTION

The previously mentioned problems are addressed with the present invention. In one form, a probe card has a cavity between and extending through first and second opposite sides of the probe card and has a plurality of probe leads attached to predetermined positions of the first side of the probe card which extend toward the cavity. The probe leads are for making electrical contact to an integrated circuit wafer. Within a portion of the probe card cavity is a probe card ring which is used to support and position the plurality of probe leads. A radiant heat means is in close proximity to the probe card ring to heat the plurality of probe leads to a predetermined temperature such that each probe lead is kept at a predetermined location within the cavity.

DETAILED DESCRIPTION OF A PREFERRED EMBODIMENT

In integrated circuit (IC) manufacturing, a plurality of ICs, or die, are fabricated on a wafer of semiconducting material. To test an individual IC's functionality before the IC is packaged, each die on the wafer is tested by an operation sometimes referred to as "wafer probe." The functional testing of ICs on a wafer is conventionally done with the use of a probe card apparatus. A probe card apparatus can take many forms, one of which is illustrated by a topographical view in FIG. 1. A probe card apparatus 10 has a probe card 12 which contains a plurality of conductive traces 14. Probe card 12 is typically made from a multi-layered flexible substrate material such as that used in printed circuit boards (PC boards). Although probe card 12 is illustrated as being round, the shape of the probe card is not relevant to use of the apparatus. Within the multi-layered probe card 12 are conductive layers which are not entirely shown, but portions of which are exposed to form conductive traces 14. A common material used to form conductive traces 14 is gold, or a gold alloy. Conductive traces 14 are illustrated as being radial toward the center of probe card 12; however, any conductive trace pattern may be employed. Although not illustrated, conductive traces 14 are "routed" or electrically connected to other conductive traces internally within probe card 12 through a plurality of interconnects 16. Internal routing of conductive traces is well known to manufacturers of multi-layer flexible substrates, such as probe card 12.

Figure 1:
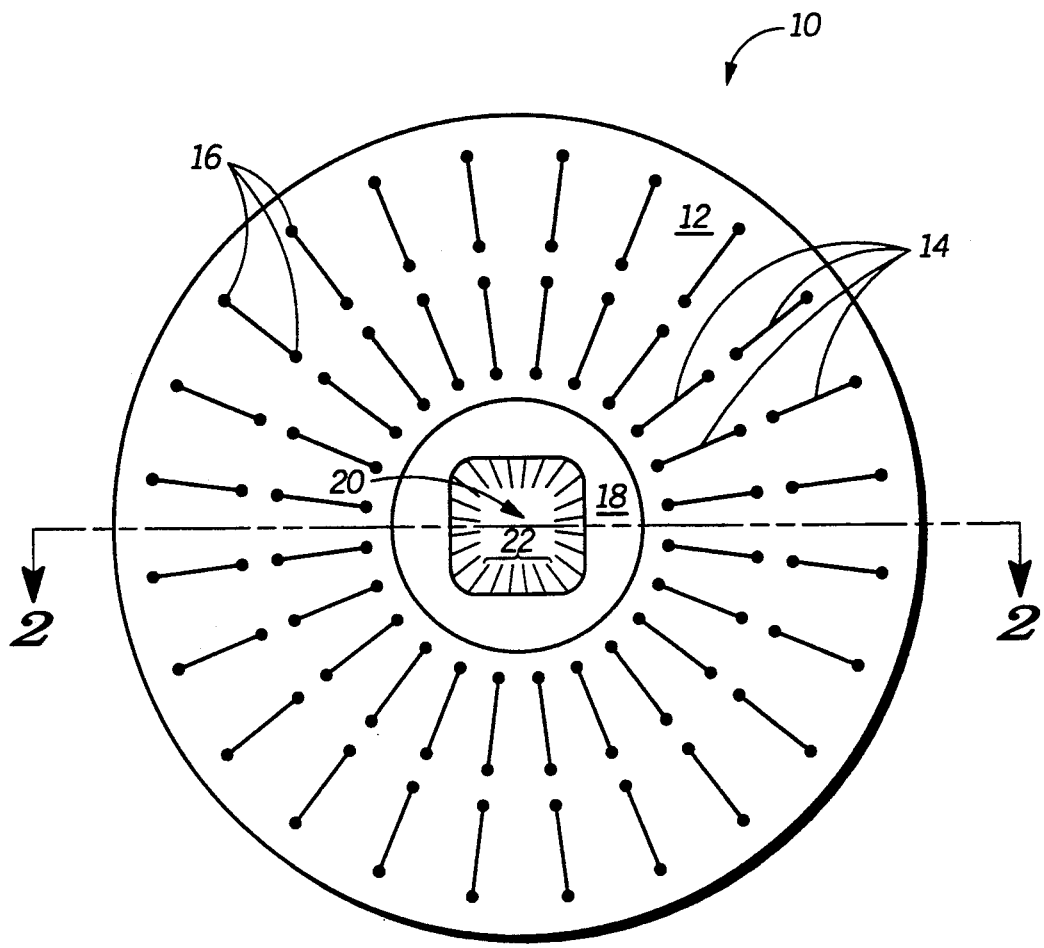
FIG. 1 is a top-down view of a conventional probe card apparatus used to functionally test integrated circuits.

Within probe card 12 of FIG. 1 is a probe card ring 18. Probe card ring 18 is located within a cavity 20 of probe card 12. Probe card ring 18 is made of a non-conductive material, such as ceramic or anodized aluminum, and is used to support a plurality of probe leads 22, also known as probe needles. Outer portions of probe leads 22 are electrically coupled to the plurality of conductive traces 14 on the underside of probe card 12 and are thus not visible in FIG. 1. Probe leads 22 extend inward from the plurality of conductive traces toward the center of probe card apparatus 10, such that inner portions of probe leads 22 can be seen through cavity 20. The probe leads are held to the underside of probe card ring 18 by use of a non-conductive adhesive (not shown) such as an epoxy.

Figure 2:
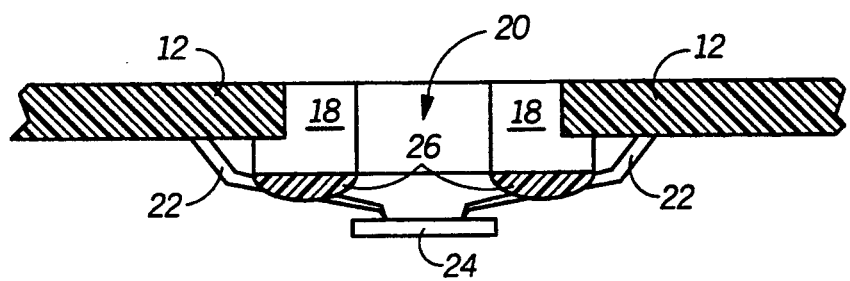
FIG. 2 is a cross-sectional view of the conventional probe card apparatus illustrated in FIG. 1 taken along the line 2—2.

To more clearly understand the components of probe card apparatus 10 of FIG. 1, a cross-sectional view of the apparatus taken along line 2—2 is illustrated in FIG. 2. Within probe card 12 are cavity 20 and probe card ring 18. While it appears that probe card 12 and probe card ring 18 each have two portions, this is due to the cross-sectional nature of FIG. 2. Looking down through cavity 20, one can see inner portions of probe leads 22. In having the inner portions of probe leads 22 visible, an operator can accurately align the probe leads to bonding pads on an IC die, such as a die 24. Outer portions of probe leads 22 are attached to probe card 12 and are electrically coupled to conductive traces (not shown) on the probe card. Probe leads 22 extend from predetermined positions of a side of probe card 12 toward cavity 20. Probe leads 22 are held in position around probe card ring 18 by use of a non-conductive adhesive material, such as an epoxy material 26. In manufacturing a probe card apparatus, an adhesive material is usually put on a surface of a probe card ring and the probe leads are positioned appropriately. The adhesive material is then cured in order to harden the material and to hold the probe leads in place.

Figure 3:
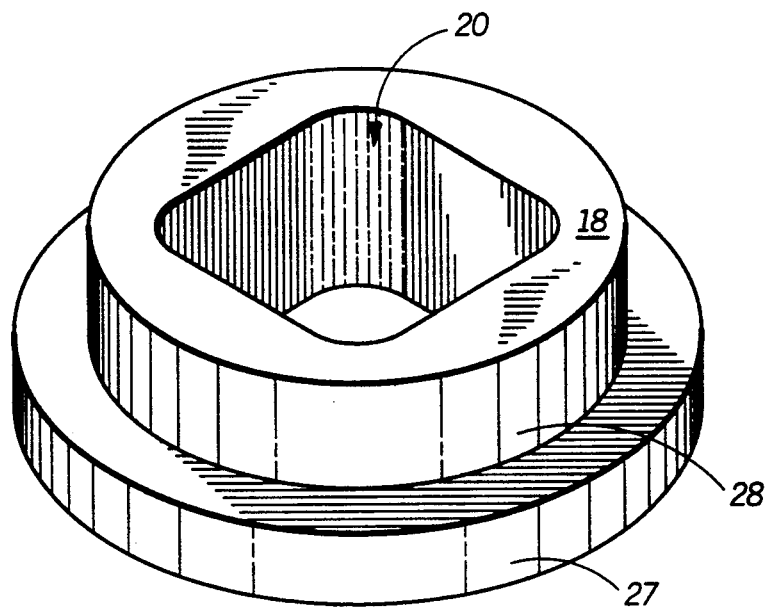
FIG. 3 is a perspective view of a known probe card ring which is used to support a plurality of probe leads in a conventional probe card apparatus.

FIG. 3 is a perspective illustration of probe card ring 18 which is representative of commercially available probe card rings. Some rings are designed with a lower portion 27 which has a larger circumference than an overlying, concentric, upper portion 28. This feature helps to secure the position of the probe card ring within a probe card, as illustrated in FIG. 2. Within probe card ring 18 is cavity 20. The shape of cavity 20 is illustrated as being square with slightly rounded corners, while the shape of the ring itself is round. Probe card rings having this feature are known as "balanced gram force" probe card rings, which implies the forces on each of a plurality of probe leads supported by the probe card ring are approximately equal. Because inner portions, or tips, of probe leads will more than likely form a rectangular shape which corresponds to a bonding pad configuration of an IC, it is preferable to have a similarly shaped support structure. Were cavity 20 to be round, the distance which probe leads would extend into the cavity would vary more substantially from one probe lead to another, thus resulting in different magnitudes of forces acting upon each probe lead. Having approximately equal forces on each probe lead helps to make "lifetimes" of individual probe leads more uniform. Another feature of many probe card rings which improves probe lead "lifetime," although not shown, is the use of an angled surface adjacent the probe leads.

An angled surface is presumed to provide improved probe lead support.

The previously described figures illustrate one example of a conventional probe card apparatus used to functionally test IC wafers. As discussed in the background, use of a conventional apparatus for testing wafers at elevated temperatures poses problems. A very significant problem is that probe leads tend to shift upon exposure to an elevated temperature. Shifting of probe leads often causes a problem in aligning the probe leads to bonding pads of an IC. Furthermore, the probe leads are subjected to fluctuating temperatures, not merely elevated temperatures. After testing one IC, the probe card apparatus is raised (or the wafer is lowered) and is indexed to the next IC to be tested. In the time it takes for the probe card apparatus to index to the next IC, the temperature of the probe leads has been reduced because the probe leads are further away from the heated chuck. Then, upon contacting the probe leads to the next IC, the temperature to the probe leads increases to near the temperature of the chuck. These temperature fluctuations continue until each IC on a given wafer has been tested. More drastic temperature changes occur upon testing a subsequent wafer because the heated chuck becomes completely removed from the probe card apparatus. Thus, the probe leads are further away from the heat source and have more time to reach ambient temperature. Upon testing the subsequent wafer, the probe leads are exposed to an elevated temperature again. This cycle of temperature changes continues repeatedly.

Figure 4:
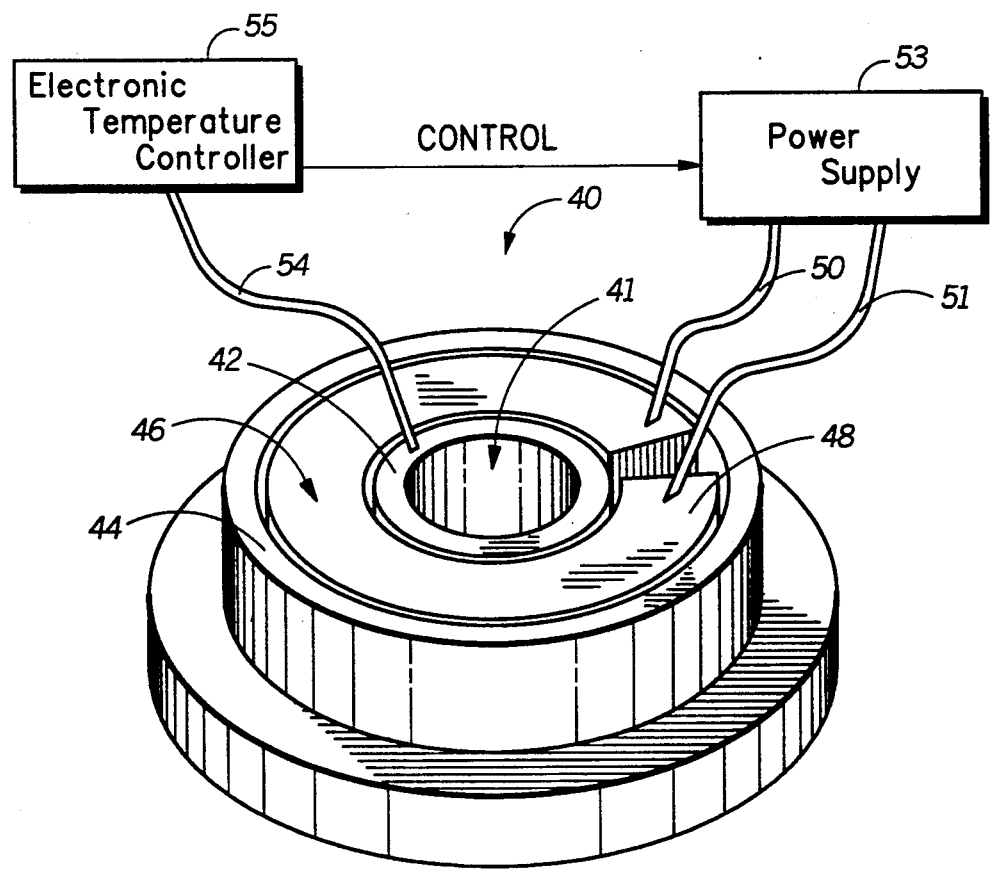
FIG. 4 is a perspective view of a probe card ring in accordance with the present invention.

The present invention resolves probe lead alignment problems due to temperature variations by providing a constant heat source in close proximity to the plurality of probe leads. In one form, a probe card ring is modified to include a constant heat source. Illustrated in FIG. 4 is a perspective view of a probe card ring 40 in accordance with the present invention. Suitable materials for probe card ring 40 include traditional probe card ring materials, for instance anodized aluminum. Within the ring is a cavity 41, similar to cavities in conventional probe card rings. While cavity 41 is illustrated as being round, cavities of a variety of shapes can be employed. Probe card ring 40 has two vertical walls, an inner wall 42 and an outer wall 44. Between inner wall 42 and outer wall 44 is a slot 46. Slot 46 can also be thought of as a groove that is formed within a single wall of a cylinder. The slot divides the single wall into two individual walls, inner wall 42 and outer wall 44, and is perpendicular to a base of the cylinder. In another embodiment, a slot or groove could be formed in an exterior wall of a cylinder, such that the slot is parallel to a cylinder base. Although slot 46 is illustrated as being continuous, a slot which is not continuous can be used. In other words, a slot can have a first and a second end. The width and depth of slot 46 are limited by other specified dimensions of probe card ring 40; however, slot 46 should be of sufficient size to receive a heat source, such as a resistive heating element 48. Resistive heating element 48 is a silicone heater which is typically formed by embedding a conductive wire, such as a wire formed from a nickel-chrome alloy, in a silicone rubber, such as RTV (room temperature vuclanizer). Suitable resistive heating materials are commercially available through several companies, such as Heatron, Inc. Resistive heating element 48 is positioned within slot 46, occupying as much space in slot 46 as possible, to maximize heat dissipation, without electrically short circuiting the heating element.

Coupled to opposite ends of resistive heating element 48 are power supply leads 50 and 51. One of either lead 50 or 51 is subjected to a positive voltage while the other lead is subjected to a negative voltage. Both the positive and negative voltages are provided by a power supply 53. Due to the presence of both a positive and a negative voltage a potential exists, thereby producing a current through resistive heating element 48. The power supply leads are coupled to opposite ends of resistive heating element 48 to provide a maximum voltage potential across the heating element. The current flowing through resistive heating element 48 increases the temperature of the heating element, which in turn heats probe card ring 40. By having probe card ring 40 heated, probe leads [not shown in FIG. 4 (refer to FIG. 2)] supported by the ring will also be heated. Thus, the probe leads will not experience a dramatic temperature change upon contacting a heated IC die and will not drift from desired positions. Either an AC (alternating current) or DC (direct current) current can be used in accordance with the present invention. However, DC current is more suited for the embodiment illustrated in FIG. 4 because an AC current may create unwanted signal noise.

The temperature of probe card ring 40 illustrated in FIG. 4 can be monitored through the use of a thermocouple 54. Thermocouple 54 is in contact with inner wall 42 and measures the wall's temperature, which is considered to be representative of the temperature of the probe card ring. Thermocouple 54 is coupled to an electronic temperature controller 55 which determines if the probe card ring temperature is within a specified range. If the temperature of probe card ring 40 is out of range, the electronic temperature controller 55 sends a control signal to the power supply 53, informing the power supply to either increase or decrease the amount of current flowing through resistive heating element 48. Whether the current is increased or decreased depends, respectively, on whether the probe card ring temperature is below or above the specified range. Electronic temperature controllers are readily available. For instance, Fuji Electronic offers several models, such as those in their PYZ Series of electronic temperature controllers. Rather than being in contact with a portion of the probe card ring, thermocouple 54 can instead be in direct contact with a portion of resistive heating element 48.

Figure 5:
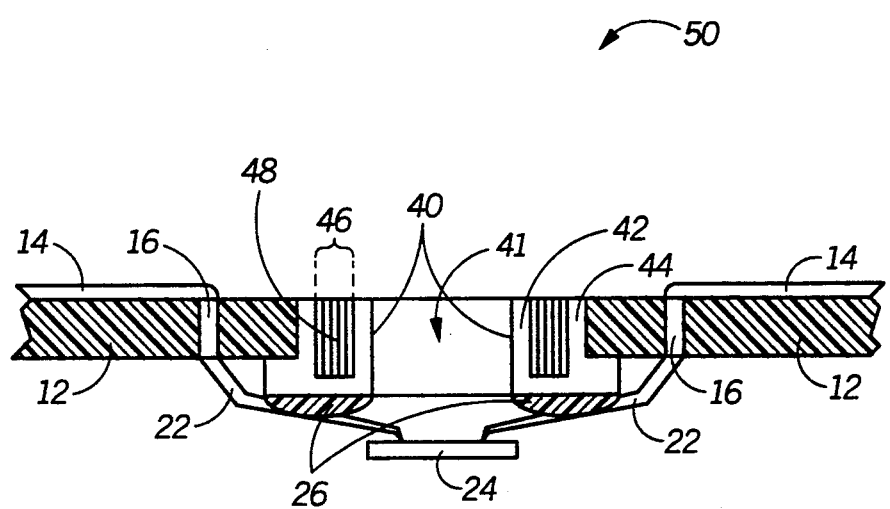
FIG. 5 is a cross-sectional view of a probe card apparatus in accordance with the present invention which includes the probe card ring illustrated in FIG. 4.

Probe card ring 40 in FIG. 4 fits in a conventional probe card, therreby forming a probe card apparatus 50 as illustrated in FIG. 5. The probe card apparatus includes probe card ring 40 which may be adapted to fit a conventional probed card, for example probe card 12. The various elements of probe card 12 which are illustrated in FIGs. 1 and 2 are also illustrated in FIG. 5 including: a plurality of conductive traces 14 formed on one side of the probe card; a plurality of probe leads 12 attached to an opposing side of the probe card; and interconnects 16 which electrically couple the conductive traces to the probe leads. As indicated previously in FIG. 4, slot 46 is formed in probe card ring 40 to accommodate heating element 48. As stated previously, heating element 48 provides a heat source to heat probe card ring 40. Heat is then transferred to the probe leads to establish a constant and uniform elevated temperature of the probe leads, thereby preventing probe lead movement upon exposure to a die or wafer held at a similar elevated temperature. Features other than those illustrated in FIG. 5 can also be incorporated into a probe card ring in accordance with the present invention. For example, a surface of the probe card ring which is adjacent to a plurality of probe leads, or probe needles, can be angled to better support the probe leads. Another feature could be an addition of a cap (not shown) to the top of the probe card ring which covers slot 46 and resistive heating element 48. Such a cap would help to maintain more heat near the probe card ring, rather than having a portion of the heat escape to the ambient. The cap would also protect the resistive heating element and associated wiring from handling damage.

The present invention thus provides an improved process for wafer probe testing at elevated temperatures. With the present invention, probe leads are held at a constant predetermined temperature, near the temperature of a heated wafer which is to be tested. Having the probe leads at an elevated temperature significantly reduces probe lead shifting, or drift. Probe lead drift is a substantial problem for IC manufacturers, a problem which is often alleviated by allotting a period of time to "preheat" the probe leads. Preheating probe leads is an unnecessary use of valuable time, and can be avoided with the use of the present invention. The present invention also saves time with respect to probe card repair operations. Probe card repair is typically performed on a periodic basis to reposition probe leads to the prescribed locations. After repeated used, probe leads often become misaligned, especially if the probe leads experience cyclic temperature fluctuations. The present invention substantially reduces the amount of temperature fluctuation, and thus increases the "lifetime" of the probe leads by increasing the time the probe leads are in use between repairs. Furthermore, repair operations are more accurate with use of the present invention. During repair, the probe leads can be held at a temperature which is the same as that used during testing. Therefore, the positions of probe leads during use will be nearly identical to the positions which were prescribed during repair.

Thus, it is apparent that there has been provided, in accordance with the present invention, a probe card apparatus and a process for using the same that fully meets the advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, use of the invention is not limited to use of a silicone resistive heater. Any heat source which is in close proximity to a probe card ring and/or in close proximity to a plurality of probe leads, such that the plurality of probe leads are held at a constant elevated temperature, may be used in accordance with the present invention. For example, a heating coil can be positioned on a probe card ring and can perform the same function as the resistive material described previously. Nor is the invention limited to using the shapes of the probe card, the probe card rings, or the cavities illustrated or described. Furthermore, the number of probe leads used in accordance with the present invention is not restricted to the number of probe leads illustrated. In addition, if a slotted probe card ring is used, it is not necessary that the length, width, shape, or direction be restricted to those described or illustrated. Therefore, it is intended that this invention encompass all such variations and modifications as fall within the scope of the appended claims.

We claim:

1. A process for functional test probing an integrated circuit wafer using a probe card apparatus, comprising the steps of:
   providing a probe card having a cavity between and through first and second opposite sides of the probe card and having a plurality of probe leads attached to predetermined positions of the first side of the probe card and extending toward the cavity for making electrical contact with the integrated circuit wafer;
   providing a probe card ring within a portion of the cavity to support and position the plurality of probe leads; and
   providing a heating element and positioning the heating element in contact with the probe card ring for heating the plurality of probe leads to a predetermined temperature to accurately keep each probe lead at a predetermined location within the cavity.

2. The process of claim 1 further comprising the step of substantially maintaining the predetermined temperature within a specified range of temperatures.

3. The process of claim 2 wherein the step of substantially maintaining the predetermined temperature further comprises placing a thermocouple in contact with a portion of the probe card ring to monitor temperature of the probe card ring.

4. The process of claim 1 wherein the step of providing a probe card ring further comprises providing a slotted ring of predetermined circumferential volume for receiving said heating element which conducts a direct current to provide radiant heat.

5. The process of claim 1 wherein the step of providing a probe card having a cavity comprises providing a probe card having a cavity substantially in a center of the probe card.

6. The process of claim 1 wherein the step of providing a probe card ring comprises providing an anodized aluminum ring.

7. The process of claim 1 wherein the step of positioning the heating element in contact with the probe card ring comprises providing said heating element adjacent the probe card ring for conducting a direct current to provide radiant heat.

8. The process of claim 7 wherein the step of positioning said heating element in contact with the probe card ring further comprises placing a thermocouple in contact with a portion of the probe card ring to monitor temperature of the probe card ring.

9. A probe card apparatus for functional test probing an integrated circuit wafer having a plurality of die, comprising:
   a probe card having a cavity between and through first and second opposite sides of the probe card and having a plurality of probe leads attached to predetermined positions of the first side of the probe card and extending toward the cavity for making electrical contact with the integrated circuit wafer;
   a probe card ring within a portion of the cavity to support and position the plurality of probe leads; and
   a heating element positioned within at least a portion of the cavity, or in contact with the probe card ring the heating element heating the plurality of probe leads to a predetermined temperature to accurately keep each probe lead at a predetermined location within the cavity.

10. The probe card apparatus of claim 9 further comprising a control means to substantially maintain the predetermined temperature within a specified range of temperatures.

11. The probe card apparatus of claim 10 wherein the control means comprises a thermocouple in contact with a portion of the probe card ring to monitor temperature of the probe card ring.

12. The probe card apparatus of claim 9 wherein the probe card ring further comprises a circumferential slot on a surface thereof, the slot having a predetermined circumferential volume for receiving said heating element which conducts a direct current to provide radiant heat.

13. The probe card apparatus of claim 9 wherein the cavity of the probe card is positioned substantially in a center of the probe card.

14. The probe card apparatus of claim 9 wherein the probe card ring is an anodized aluminum ring.

15. The probe card apparatus of claim 9 wherein the heating element is a resistive material positioned adjacent the probe card ring for conducting a direct current to provide radiant heat.

16. The probe card apparatus of claim 15 further comprising a thermocouple in contact with a portion of the probe card ring to monitor temperature of the probe card ring.

17. A process for functional test probing an integrated circuit wafer using a probe card apparatus, comprising the steps of:

providing a probe card having first and second opposite sides, a cavity which extends from the first side to the second side, and a plurality of conductive traces located on the second side of the probe card;

providing a plurality of probe leads attached to the first side of the probe card and electrically coupled to the plurality of conductive traces;

providing a non-conductive probe card ring located within the cavity of the probe card which is used to support the plurality of probe leads in predetermined positions, the probe card ring having a slot formed within a surface of the probe card ring; and heating the probe card ring to a predetermined temperature with a resistive heating element located, at least in part, within the slot of the probe card ring, the plurality of probe leads which are supported by the probe card ring also being heated in order to accurately keep the probe leads in the predetermined positions.

18. The process of claim 17 further comprising the step of maintaining the predetermined temperature within a specified range of temperatures by monitoring temperture of the probe card ring with a thermocouple and controlling temperature of the probe card ring with an electronic temperature controller.

19. The process of claim 17 wherein the step of heating the probe card ring to a predetermined temperature comprises heating the probe card ring to a predetermined temperature substantially greater than 25° C.

20. The process of claim 17 wherein the step of providing a non-conductive probe card ring comprises providing an anodized aluminum probe card ring having a continuous, circumferential slot therein.

* * * * *